(12) United States Patent
Kang

(10) Patent No.: US 11,276,718 B2
(45) Date of Patent: Mar. 15, 2022

(54) IMAGE SENSOR STRUCTURE AND MANUFACTURING METHOD THEREOF

(71) Applicant: SHANGHAI IC R & D CENTER CO., LTD., Shanghai (CN)

(72) Inventor: Xiaoxu Kang, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 32 days.

(21) Appl. No.: 16/618,343

(22) PCT Filed: Jun. 30, 2017

(86) PCT No.: PCT/CN2017/091083
§ 371 (c)(1),
(2) Date: Nov. 30, 2019

(87) PCT Pub. No.: WO2019/000385
PCT Pub. Date: Jan. 3, 2019

(65) Prior Publication Data
US 2021/0143194 A1    May 13, 2021

(30) Foreign Application Priority Data

Jun. 29, 2017 (CN) .......................... 201710516396.9
Jun. 29, 2017 (CN) .......................... 201710516399.2
Jun. 29, 2017 (CN) .......................... 201710516500.4
Jun. 29, 2017 (CN) .......................... 201710517118.5

(51) Int. Cl.
*H01L 27/146* (2006.01)

(52) U.S. Cl.
CPC .. *H01L 27/14605* (2013.01); *H01L 27/14683* (2013.01)

(58) Field of Classification Search
CPC ......... H01L 27/14605; H01L 27/14683; H01L 27/14607; H01L 27/14649; H01L 27/14601
See application file for complete search history.

(56) References Cited

U.S. PATENT DOCUMENTS

| 6,507,021 B1 | 1/2003 | Brood |
| 2015/0139392 A1* | 5/2015 | Maack ................ A61B 6/4233 378/62 |
| 2017/0016762 A1* | 1/2017 | Van Buggenhout ...... G01J 5/06 |
| 2019/0154513 A1* | 5/2019 | Frank .................... G01J 5/0265 |

FOREIGN PATENT DOCUMENTS

CN          102692276 A1    10/2015

* cited by examiner

*Primary Examiner* — David Vu
(74) *Attorney, Agent, or Firm* — Tianchen LLC.; Yuan R. Li; Yi Fan Yin

(57) ABSTRACT

The present disclosure relates to an image sensor structure and a manufacturing method thereof. A detection structure layer and a blind pixel structure layer are used. The detection structure layer and the blind pixel structure layer are effectively combined and further formed by ion implantation. Thus, the space ratio of a single pixel is reduced, the integration and device sensitivity are improved, and the blind pixel array and the pixel array are also in the same environment, thereby further improving the detection sensitivity and reducing the detection error.

10 Claims, 18 Drawing Sheets

IMAGE SENSOR STRUCTURE AND MANUFACTURING METHOD THEREOF

CROSS-REFERENCE TO RELATED APPLICATION

This application claims priority of International Patent Application Serial No. PCT/CN2017/091083, filed Jun. 30, 2017, which is related to and claims priority of Chinese patent application Serial No. 201710516396.9, 201710516399.2, 201710516500.4, 201710517118.5 filed Jun. 29, 2017. The entirety of each of the above-mentioned patent applications is hereby incorporated herein by reference and made a part of this specification.

TECHNICAL FIELD

The present disclosure relates to the technical field of integrated circuits, in particular to an image sensor structure and a manufacturing method thereof.

BACKGROUND

In a traditional infrared image sensor chip design, a blind pixel array and an effective pixel array are not in the same region at all. And a structure of one row (or several rows) or one column (or several columns) is usually arranged outside the effective pixel array, the structure is designed into the blind pixel array, and a shared blind pixel structure is realized through control signals in the same column, the influence of thermal noise on sensitivity is eliminated through different infrared thermal sensitivity of the blind pixel array and the pixel array;

However, in a traditional infrared image sensor structure, since the blind pixel array and the pixel array are not in the same region, the blind pixel array and the pixel array are in different environment, the thermal noise of the blind pixel array and the pixel array can be different, therefore the detection sensitivity of the infrared image sensor is influenced.

SUMMARY

In order to overcome the above problems, the present disclosure aims to provide an image sensor structure and a manufacturing method thereof, thereby integrating a pixel structure layer into an effective pixel, so that the environments of the blind pixel array and the pixel array are the same, and the image detection sensitivity is improved.

In order to achieve the above object, the present disclosure provides an image sensor structure which has an effective pixel array, wherein each effective pixel in the effective pixel array comprises: a detection structure layer and a blind pixel structure layer.

Preferably, the detection structure layer adopts a first conductivity type sensitive material layer, and the blind pixel structure layer adopts a second conductivity type non-sensitive material layer; the first conductivity type and the second conductivity type are different.

Preferably, one end of the detection structure layer and one end of the blind pixel structure layer are jointly connected to a first shared extraction electrode, and the other end of the detection structure layer and the other end of the blind pixel structure layer are respectively connected to a second extraction electrode and a third extraction electrode.

Preferably, the top view of each effective pixel is triangular, and a first conductive beam, a second conductive beam, and a third conductive beam are disposed outside the triangle, and the first conductive beam, the second conductive beam, and the third conductive beam are parallel to the three sides of the triangle respectively; one end of the detection structure layer and one end of the blind pixel structure layer are located at one corner of the triangle, and are electrically connected to the first shared extraction electrode through the first conductive beam, and the other end of the detection structure layer is located at one of the remaining two corners of the triangle, is connected to the second extraction electrode through a second conductive beam, and the other end of the blind pixel structure layer is located at the remaining corner of the triangle and is connected to the third extraction electrode through the third conductive beam.

Preferably, adjacent sides between the triangular effective pixels are parallel. Preferably, the detection structure layer and the blind pixel structure layer are arranged side by side in a serpentine shape and have space in between.

Preferably, the blind pixel structure layer is arranged inside or outside the surface of the detection structure layer.

Preferably, the top, bottom, and sidewalls of the detection structure layer are covered by the blind pixel structure layer.

Preferably, the effective pixel further comprises an undoped fin structure, and the detection structure layer and the blind pixel structure layer are respectively located on the surfaces of the two sidewalls of the undoped fin structure.

Preferably, the undoped fin structure has at least two, and each of the undoped fin structures is arranged in parallel and has space in between.

Preferably, each fin structure is U-shaped or serpentine-shaped on a horizontal plane.

Preferably, each fin structure has M sub-fin structures, wherein the amount of M−1 sub fin structures are arranged in parallel, wherein the remaining one of the sub-fin structures is vertically intersected with each end of the M−1 sub-fin structures to form a comb-shaped structure. The comb-shaped fin structure comprises comb teeth and a trunk; and the outermost side of the outer surface of the comb teeth and the outer surface of the trunk are provided with the detection structure layer, and the inner side surface of the trunk and the sidewalls of the comb teeth are provided with the blind pixel structure layer; or the outermost side of the outer surface of the comb teeth and the outer surface of the trunk are provided with the blind pixel structure layer, and the inner side surface of the trunk and the sidewalls of the comb teeth are provided with the detection structure layer.

Preferably, the upper electrode layer of the detection structure layer connecting each fin structure is connected from the sidewall surface of the fin structure and led out connected; the lower electrode layer of the blind pixel structure layer connecting each fin structure is connected led out from the bottom of the fin structure and led out.

Alternatively, the upper electrode layer of the blind pixel structure layer connecting each fin structure is connected from the sidewall surface of the fin structure and led out; the lower electrode layer of the detection structure layer connecting each fin structure is connected from the bottom of the fin structure and led out.

Preferably, an injection barrier layer is also provided on top of the undoped fin structure.

In order to achieve the above object, the present disclosure also provides a manufacturing method for an image sensor structure, comprising the process of preparing an effective pixel array, wherein the preparing method of each effective pixel comprises: forming a first conductivity type sensitive material layer as a detection structure layer, and forming a second conductivity type non-sensitive material layer as a blind pixel structure layer.

Preferably, forming the detection structure layer comprises:

Step 01: depositing a first material layer;

Step 02: conducting a first ion implantation process, injecting first conductivity type impurities into the first material layer, and patterning the first material layer to form a detection structure layer;

Forming a pixel structure layer includes:

Step 03: conducting a second ion implantation process, injecting second conductivity type impurities into the surface of the detection structure layer, thereby forming a pixel structure layer in the surface layer of the detection structure layer.

Preferably, in the step 03, the second ion implantation process comprises: firstly injecting perpendicularly to the surface of the detection structure layer, and then tilted injecting into the sidewall of the detection structure layer, thereby forming a blind pixel structure layer in the sidewall surface, the bottom surface, and the top surface of the detection structure layer.

Preferably, in the step 03, the second ion implantation process comprises: injecting perpendicularly only to the top and the bottom surface of the detection structure layer, thereby forming a blind pixel structure layer in the surface layer of the top and bottom of the detection structure layer.

Preferably, the preparing method of the effective pixels comprises:

Step 01: providing a semiconductor substrate;

Step 02: preparing a lower electrode layer on the surface of the semiconductor substrate;

Step 03: preparing at least one undoped fin structure on the lower electrode layer;

Step 04: forming a detection structure layer on a sidewall surface of the undoped fin structure;

Step 05: forming a blind pixel structure layer on the other sidewall surface of the undoped fin structure;

Step 06: preparing an upper electrode layer on the semiconductor substrate; wherein the bottom of the detection structure layer is electrically connected to the lower electrode layer, and the outer sidewall of the blind pixel structure layer is connected to the upper electrode layer; or the outer sidewall of the detection structure layer is connected to the upper electrode layer, and the bottom of the blind pixel structure layer is connected to the lower electrode layer.

Preferably, in the step 03, further comprises: forming an injection barrier layer on the top of the at least one undoped fin structure.

Preferably, in the step 04, the formation of the detection structure layer comprises: conducting a first conductivity type ion implantation process, and tilted injecting ions at a first angle of the clockwise rotation in a horizontal direction into one sidewall surface of the undoped fin structure, forming a first conductivity type sensitive material layer in a sidewall surface of the undoped fin structure as a detection structure layer;

In the step 05, the formation of the blind pixel structure layer comprises: conducting a second conductivity type ion implantation process, and tilted injecting ions at a second angle of the clockwise rotation in a horizontal direction into the other sidewall surface of the undoped fin structure, forming a second conductivity type non-sensitive material layer in the other sidewall surface of the undoped fin structure as a blind pixel structure layer.

Preferably, the first angle is complementary to the second angle.

Preferably, in the step 04, the formation of the detection structure layer comprises: forming a first material layer on a sidewall surface of the undoped fin structure, and tilted injecting ions at a first angle of the clockwise rotation in a horizontal direction into the first material layer, so that the first material layer forms a first conductivity type sensitive material layer and serves as the detection structure layer;

In the step 05, the formation of the blind pixel structure layer includes: forming a second material layer on the other sidewall surface of the undoped fin structure, and tilted injecting ions at a second angle of the clockwise rotation in a horizontal direction into the second material layer, so that the second material layer forms a second conductivity type non-sensitive material layer and serves as the blind pixel structure layer;

Preferably, the first angle is complementary to the second angle.

Preferably, in the step 03, the fin structure is prepared by an etching process, and each fin structure is arranged in parallel and spaced apart, and is arranged in a U-shape or a serpentine shape on the horizontal plane; or each fin structure has M sub-fin structures. Wherein the amount of M−1 sub-fin structures are arranged in parallel, wherein the remaining one of the sub-fin structures is perpendicularly intersected with each end of the M−1 sub fin structures to form a comb-shaped structure; the outer sidewall surface of the comb-shaped fin structure is provided with a detection structure layer, and the inner sidewall surface of the comb-shaped fin structure is provided with a blind pixel structure layer; or the outer sidewall surface of the comb-shaped fin structure is provided with a blind pixel structure layer, and the inner sidewall surface of the comb-shaped fin structure is provided with a detection structure layer.

Preferably, the top view of each of the fin structure is a triangle.

The image sensor structure of the present disclosure is design to effectively combine the detection structure layer and the blind pixel structure layer, thereby not only reducing the space ratio of a single pixel, but also improving the chip integration degree and device sensitivity, and the blind pixel array and pixel array are in the same environment, which further improves the detection sensitivity and reduces the detection error. In addition, in the embodiments of the present disclosure, the detection structure layer and the blind pixel structure layer can also be formed on the vertical sidewall of the fin structure, which not only integrates the detection structure layer and the blind pixel structure layer into the same effective pixel, thereby saving the pixel ratio to increase the degree of integration; Moreover, according to the formula $R=\rho*L/(W*t)$, wherein W is the width, L is the length, and t is the thickness; here, the thickness of the doped film is ignored, the thickness of the undoped film is L, and the length of the fin structure is taken as W, so that the obtained error R is small, and the flexible adjustment of the resistance of the infrared detector is realized, and the influence of lithography and film thickness is not affected, and the detection sensitivity is further improved.

DETAILED DESCRIPTION

In order to make the content of the present disclosure clearer and easier to understand, the contents of the present disclosure will be further described below in conjunction with the drawings. Of course, the invention is not limited to the specific embodiments, and general substitutions well known to those skilled in the art are also encompassed within the protection scope of the present disclosure.

In the image sensor structure design of the present disclosure, the design distribution of the existing effective pixel array and the blind pixel array is changed, and the blind pixel array area in the existing design is deleted. In order to improve the detection sensitivity and effectively eliminate the noise, the blind pixel structure layer and the detection structure layer are combined in the effective pixel, thereby not only reducing the volume, improving the device integration degree, but also effectively improving the device detection sensitivity.

In addition, in one embodiment of the present disclosure, the output of each effective pixel adopts a three-terminal output, thereby not only saving the space, improving the integration degree, but also realizing the synchronous and fast output of the detection structure layer and the blind pixel structure layer.

Embodiment 1

The present disclosure will be further described in detail below with reference to FIGS. 1 to 12 and a specific embodiment. Here, the thin line triangles in FIGS. 1, 3, and 6 to 12 indicate that the shape of the effective pixel is approximately a triangle, but this is not intended to limit the scope of protection of the present disclosure. It should be noted that the drawings all adopt a very simplified form and use the non-precise proportion and are only used for conveniently and clearly achieving the purpose of assisting in describing the embodiment.

Figure 1:
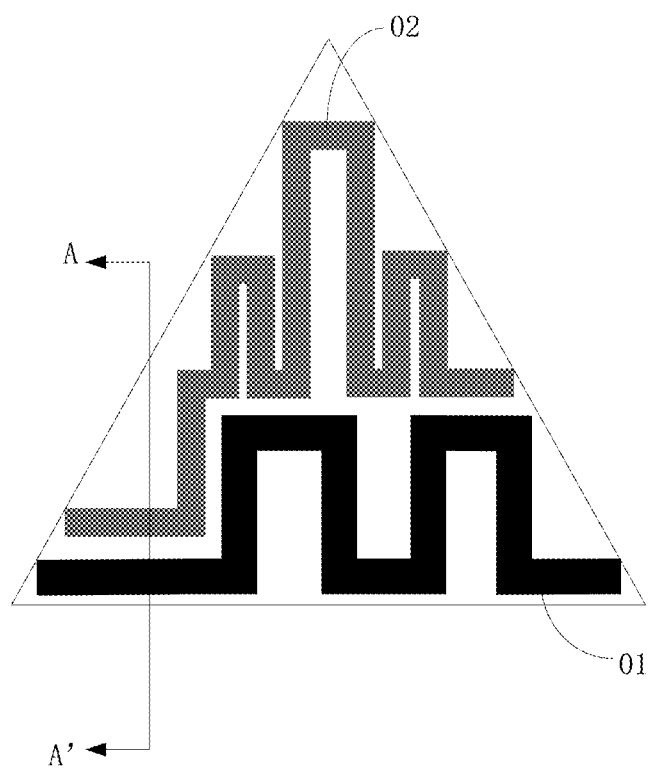
FIG. 1 is a top view of an effective pixel of an image sensor according to a first embodiment of the present disclosure.
Figure 2:
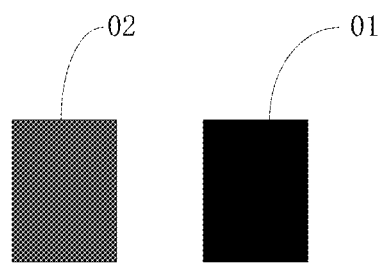
FIG. 2 is a schematic cross-sectional structure diagram of an effective pixel of an image sensor according to the first embodiment of the present disclosure

Please refer to FIG. 1 and FIG. 2. FIG. 2 is a schematic cross-sectional structure diagram of FIG. 1 in the AA'direction. In an image sensor structure of this embodiment, each of the effective pixels in the effective pixel array includes a detection structure layer 01 and a blind pixel structure layer 02. Here, the detection structure layer 01 and the blind pixel structure layer 02 are arranged side by side, and of course, they may be arranged side by side in parallel.

In this embodiment, the detection structure layer 01 adopts a first conductivity type sensitive material layer, and the blind pixel structure layer 02 adopts a second conductivity type non-sensitive material layer; the first conductivity type and the second conductivity type are different. Here, the first conductivity type is P-type, and the second conductivity type is N-type, where the first conductivity type sensitive material layer is P-type amorphous silicon, and the second conductivity type non-sensitive material layer is N-type amorphous silicon. In this embodiment, the triangular effective pixel can be implemented with the three-terminal output. Referring to FIG. 1, the detection structure layer 01 and the blind pixel structure layer 02 can be arranged side by side in a serpentine shape and have space in between, and the top view is a triangular shape. In order to make the result obtained by the three-terminal output more sensitive, the total length of the detection structure layer 01 can be designed to be the same as the total length of the blind pixel structure layer 02.

Figure 3:
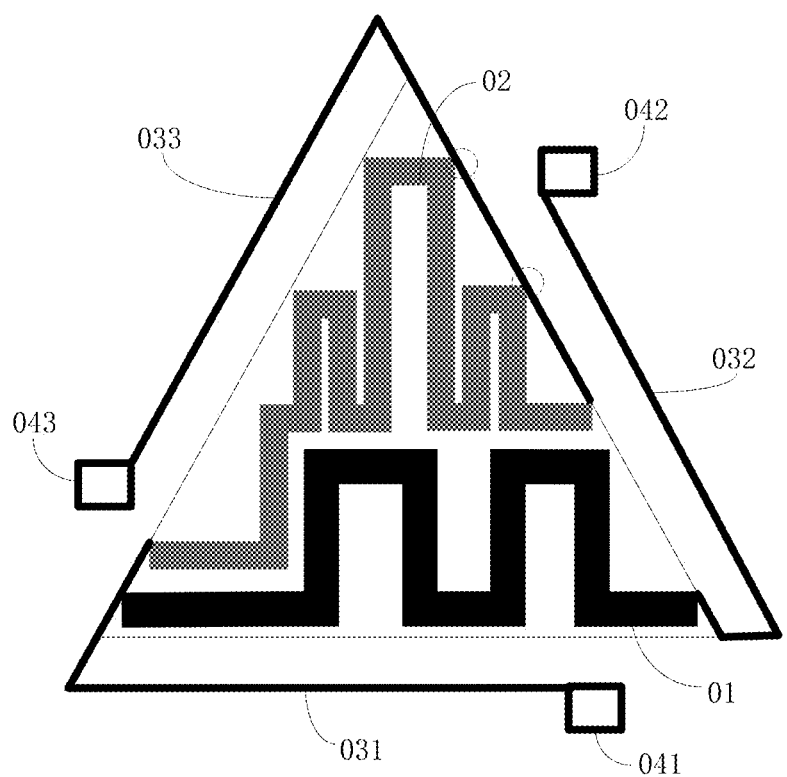
FIG. 3 is a schematic structure diagram of an effective pixel and a conductive beam of an image sensor according to the first embodiment of the present disclosure

In order to realize the synchronous output of the detection structure layer and the blind pixel structure layer, in this embodiment, please refer to FIG. 3. The thick solid line in FIG. 3 represents conductive beams 031, 032, and 033, and one end of the detection structure layer 01 and one end of the blind pixel structure layer 02 are jointly connected to a first shared extraction electrode 041, and the other end of the detection structure layer 01 and the other end of the blind pixel structure layer 02 are respectively connected to the second extraction electrode 042 and the third extraction electrode 043. In this embodiment, the top view of each effective pixel is triangular, and the first conductive beam 031, the second conductive beam 032, and the third conductive beam 033 are disposed outside the triangle, and the first conductive beam, the second conductive beam and the third conductive beam are parallel to the three sides of the triangle respectively; one end of the detection structure layer 01 and one end of the blind pixel structure layer 02 are located at one corner of the triangle, and are electrically connected to the first shared extraction electrode 041 through the first conductive beam 031, and the other end of the detection structure layer 01 is located at one of the remaining two corners of the triangle and is connected to the second extraction electrode 042 through the second conductive beam 032. The other end of the blind pixel structure layer 02 is located at the remaining corner of the triangle and is connected to the third extraction electrode 043 through the third conductive beam 033. As shown in FIG. 3, one end of the detection structure layer 01 and one end of the blind pixel structure layer 02 extend in the same first direction and are connected to the conductive beam 031; the other end of the detection structure layer 01 extends in a second direction opposite to the first direction and is connected with the conductive beam 032; the other end of the blind pixel structure layer 02 extends in the second direction opposite to the first direction, and is connected to the conductive beam 033. It should be noted that the conductive beam 033 may not be connected with the other end of the blind pixel structure layer 02, and is directly connected with the part of the blind pixel structure 02 which is close to the vertex angle of the triangle, as shown in the dotted line circle in FIG. 3. For example, the triangle includes: a first side, a second side, a third side, a first angle sandwiched between the first side and the second side, a second angle sandwiched between the second side and the third side, a third angle sandwiched between the third side and the first side; one end of the first conductivity type sensitive material layer and one end of the second conductivity type non-sensitive material layer are located at the first angle of the triangle, and the first shared extraction electrode 041 is connected to one end of the first conductivity type sensitive material layer and one end of the second conductivity type non-sensitive material layer through the first conductive beam 031 which is paralleled to the first side; the other end of the first conductivity type sensitive material layer is located at the second angle of the triangle, the second extraction electrode 042 is connected to the other end of the first conductivity type sensitive material layer through the second conductive beam 032 which is paralleled to the second side; the other end of the second conductivity type non-sensitive material layer is located at the third angle of the triangle, the third extraction electrode 043 is connected to the other end of the second conductivity type non-sensitive material layer through the third conductive beam 033 which is paralleled to the third side.

Figure 4:
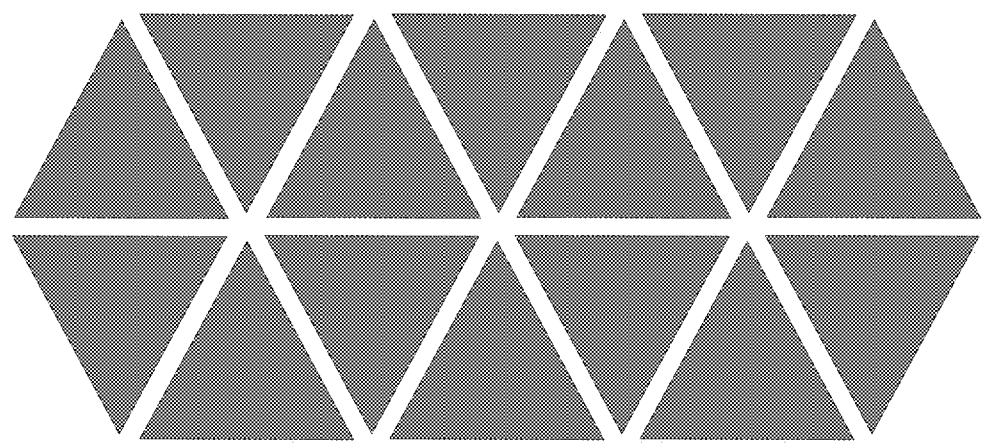
FIG. 4 is a top view of an effective pixel array according to the first embodiment of the present disclosure

Referring to FIG. 4, each of the effective pixels of the present embodiment is simplified using a triangle in FIG. 4, where adjacent sides between the triangular effective pixels are parallel and are arranged accordingly. Thereby, an effective pixel area is obtained, thereby improving the detection area, integration degree, and detection sensitivity.

Figure 5:
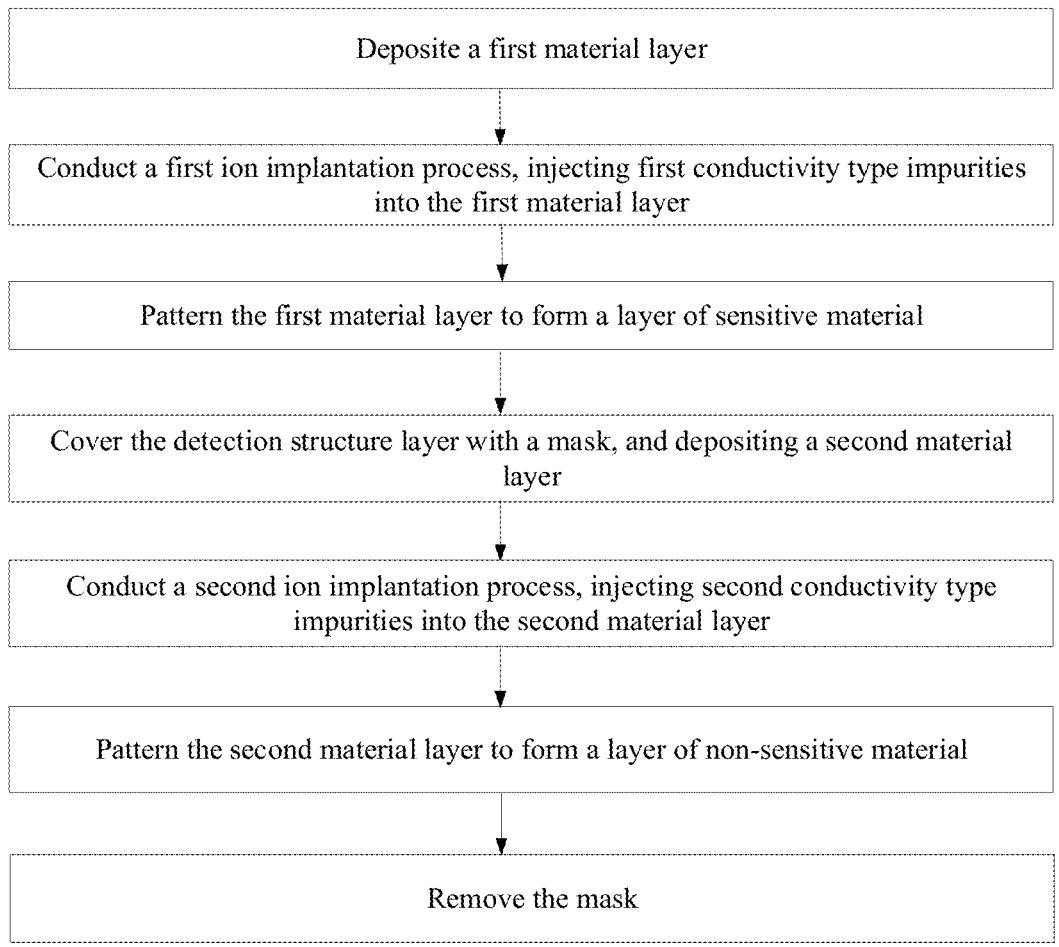
FIG. 5 is a flow diagram of an effective pixel preparing method according to the first embodiment of the present disclosure
Figure 6:
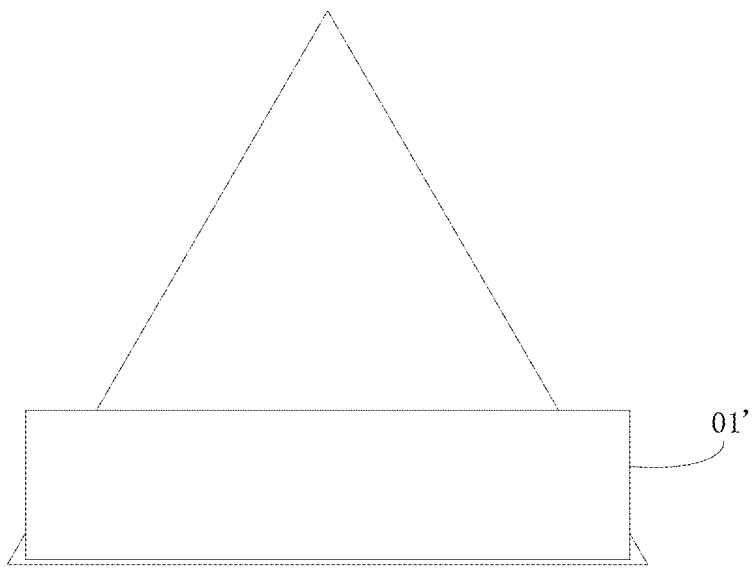
FIGS. 6-12 are schematic diagrams of various steps of an effective pixel preparing method according to the first embodiment of the present disclosure

Referring to FIG. 5, an manufacturing method for image sensor structure of the present embodiment includes a process of preparing an effective pixel array, wherein the preparation process of each effective pixel includes: forming a first conductivity type sensitive material layer as a detection structure layer, and forming a second conductivity type non-sensitive material layer as a blind pixel structure layer. Specifically, the following steps may be included:

First, referring to FIG. 6, depositing a first material layer 01'; here, the material for the first material layer 01' could be amorphous silicon.

Figure 7:
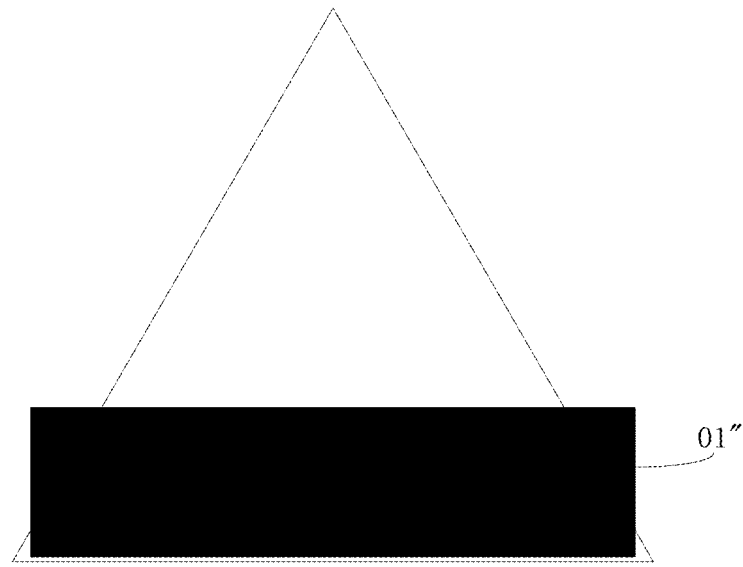
Figure 8:
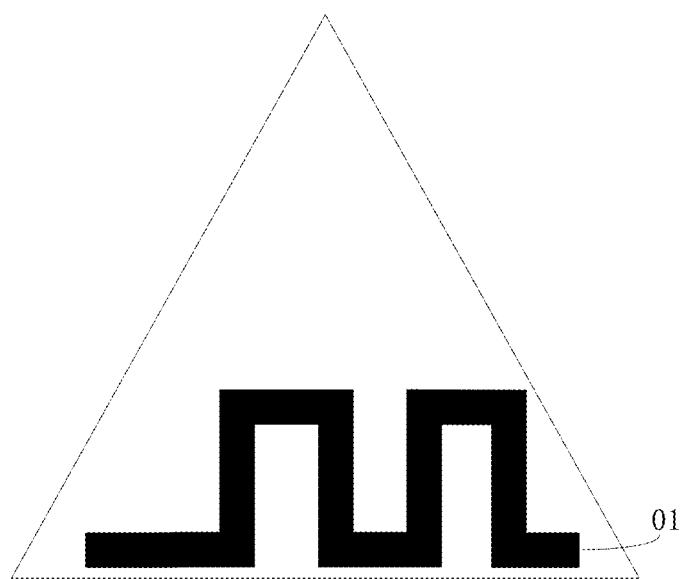
Figure 9:
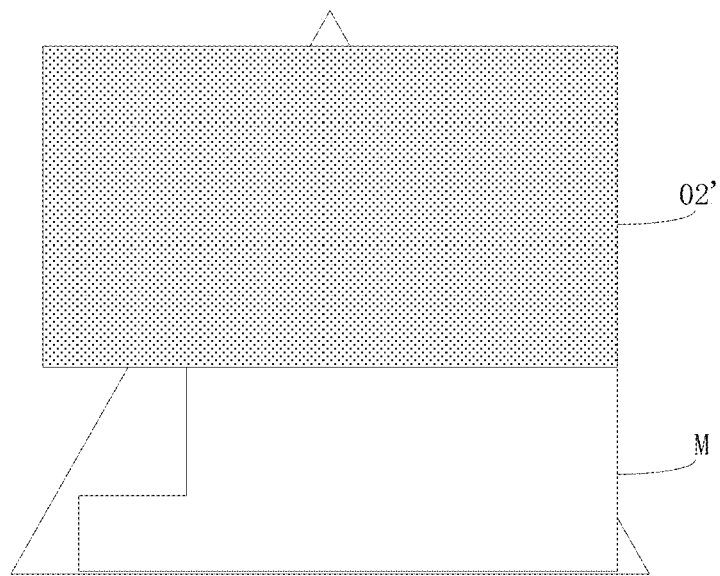

Then, referring to FIG. 7, conducting a first ion implantation process, injecting first conductivity type impurities into the first material layer 01' to form an ion-implanted first material layer 01";

Next, referring to FIG. 8, patterning the first material layer 01" to form a sensitive material layer, that is, the detection structure layer 01;

Then, referring to FIG. 9, covering the detection structure layer 01 with a mask M, and depositing a second material layer 02'; here, the material for the second material layer 02' could be amorphous silicon. The material of the mask could be an organic material such as a photoresist or an inorganic material.

Figure 10:
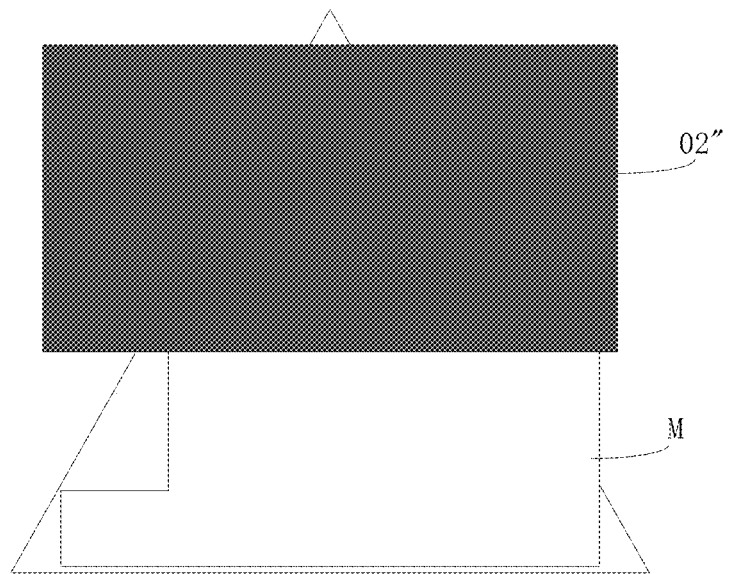
Figure 11:
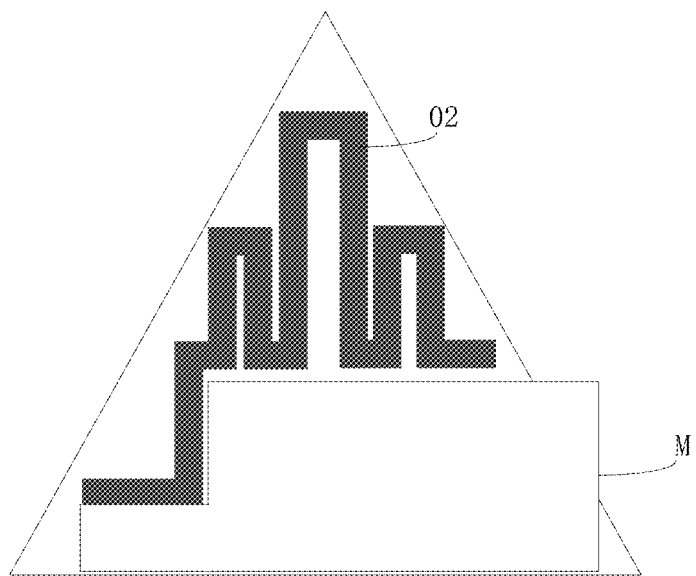
Figure 12:
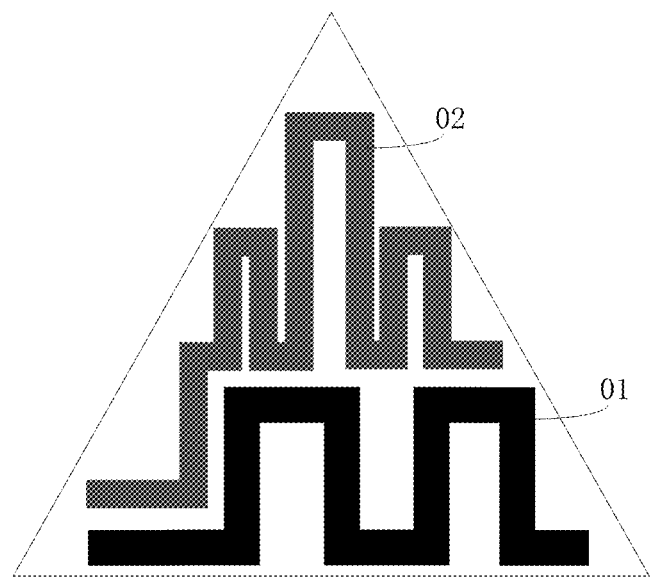

Next, referring to FIG. 10, conducting a second ion implantation process, injecting second conductivity type impurities into the second material layer 02' to form an ion-implanted second material layer 02";

Then, referring to FIG. 11, patterning the second material layer 02" to form a non-sensitive material layer, that is, the blind pixel structure layer 02;

Finally, referring to FIG. 12, removing the mask M.

Embodiment 2

The present disclosure will be further described in detail below with reference to FIGS. 13 to 23 and specific embodiments. Here, the thin line triangle in FIG. 13 indicates that the shape of the effective pixel is approximately a triangle, and in order to clearly express the morphology of the detection structure layer and the blind pixel structure layer, the depressed portion of the blind pixel structure layer is represented as white, but this is not intended to limit the scope of protection of the present disclosure. It should be noted that the drawings all adopt a very simplified form and use the non-precise proportion and are only used for conveniently and clearly achieving the purpose of assisting in describing the embodiment.

Figure 13:
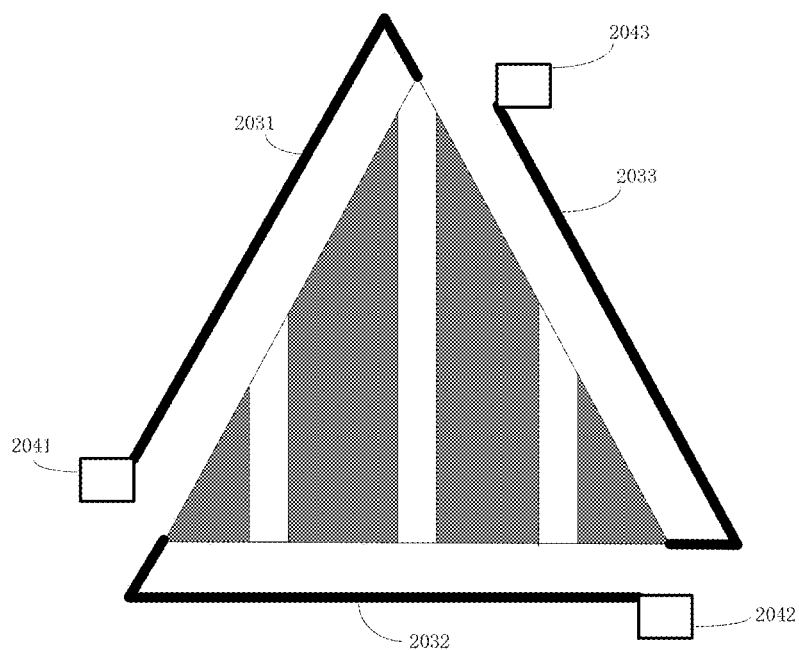
FIG. 13 is a top view of an effective pixel of an image sensor according to a second embodiment of the present disclosure.
Figure 14:
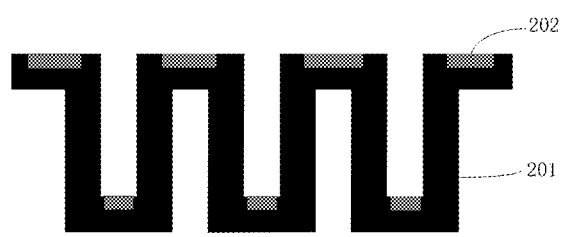
FIG. 14 is a schematic cross-sectional structure diagram of an effective pixel of an image sensor according to the second embodiment of the present disclosure
Figure 15:
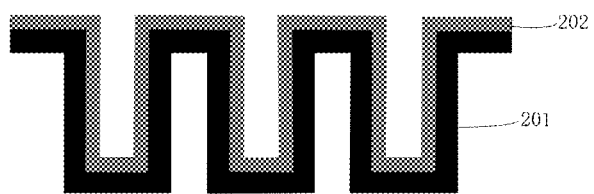
FIG. 15 is a schematic cross-sectional structure diagram of an effective pixel of an image sensor according to the second embodiment of the present disclosure

Referring to FIGS. 13-15, the effective pixel of the second embodiment is different from the effective pixel of the first embodiment, the surface of the detection structure layer 201 is internally provided with a blind pixel structure layer 202 in the second embodiment. In the first embodiment, the detection structure layer 01 and the blind pixel structure layer 02 are arranged side by side at a certain interval. However, in FIG. 14, the inside of the surface of the detection structure layer 201, that is, the surface layer includes the blind pixel structure layer 202, and the blind pixel structure layer 202 is located only in the surface layer of the top and bottom of the detection structure layer 201. Further, in FIG. 15, the top, bottom and sidewall of the detecting structure layer 201 comprise a blind pixel structure layer 202, i.e., the blind pixel structure layer 202 is ion-implanted into the top, bottom and sidewall surfaces of the detection structure layer 201.

Referring to FIGS. 13-15, the blind pixel structure layer 201 and the detection structure layer 202 form a serpentine distribution. In order to realize the three-terminal output, the top view of the serpentine distribution has a triangular shape as shown in FIG. 13.

Figure 16:
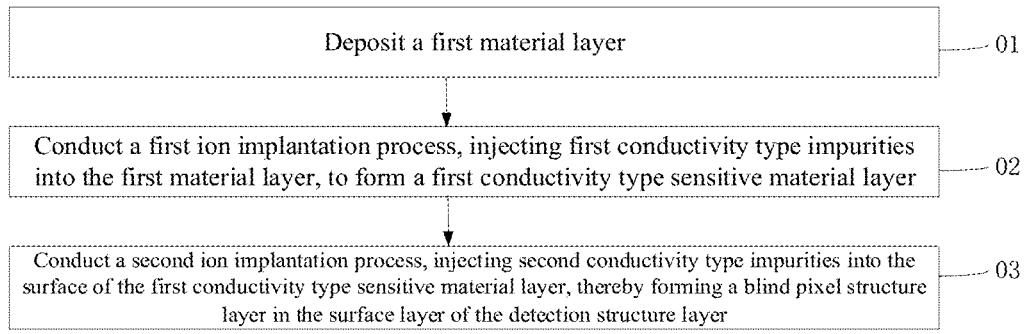
FIG. 16 is a flow diagram of an effective pixel preparation method according to the second embodiment of the present disclosure
Figure 17:
FIGS. 17-23 are schematic diagrams of various steps of an effective pixel preparation method according to the second embodiment of the present disclosure
Figure 18:
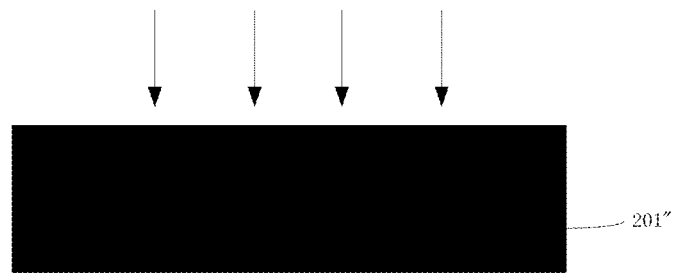

Referring to FIG. 16, a manufacturing method for an image sensor structure of the present embodiment includes a process of preparing an effective pixel array, wherein the preparation process of each effective pixel includes the following steps:

Forming the detection structure layer includes:

Step 01: Referring to FIG. 17, depositing a first material layer 201';

Step 02: Referring to FIG. 18 conducting a first ion implantation process, injecting first conductivity type impurities into the first material layer 201' to form 201"; and patterning the first conductivity type sensitive material layer to form the detection structure layer 201, as shown in FIG. 19;

Forming the pixel structure layer includes:

Step 03: conducting a second ion implantation process, injecting second conductivity type impurities into the surface of the detection structure layer 201, thereby forming a blind pixel structure layer 202 in the surface layer of the detection structure layer 201.

Figure 19:
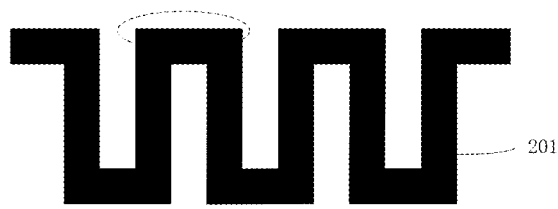
Figure 20:
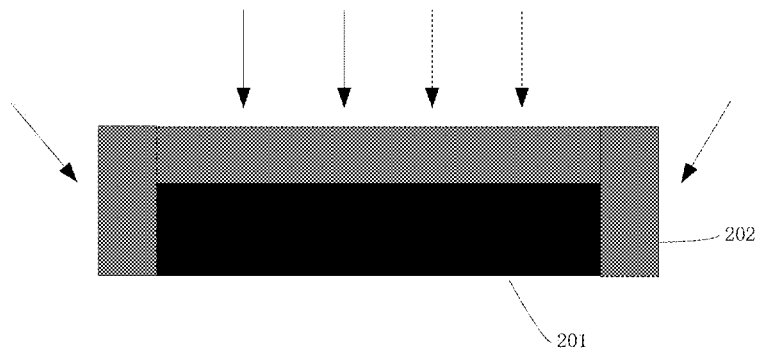
Figure 21:
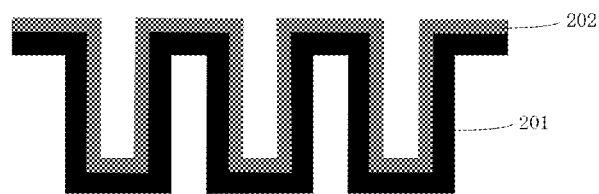
Figure 22:
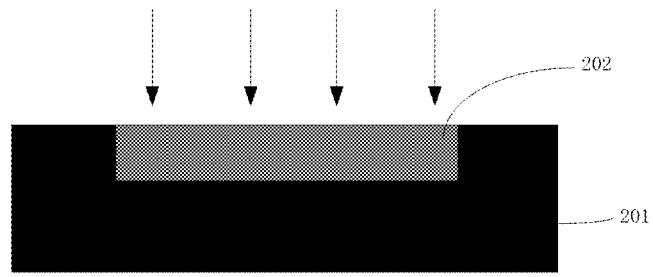

Specifically, the following FIGS. 20 and 22 are enlarged cross-sectional views of the area indicated by the dotted circle in FIG. 19, referring to FIGS. 20-21, in step 03, the second ion implantation process includes: referring to FIG. 20, firstly injecting perpendicularly to the surface of the detection structure layer 201, and then tilted injecting into the sidewall of the detection structure layer 201, thereby forming a blind pixel structure layer 202 in the sidewall surface, the bottom surface, and the top surface of the detection structure layer 201.

Figure 23:
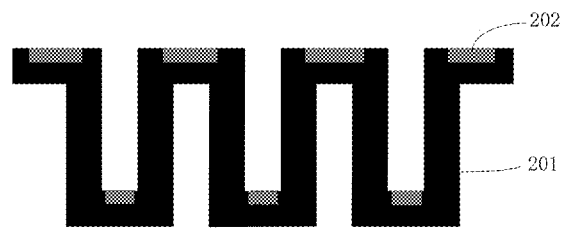

In addition, referring to FIGS. 22-23, the second ion implantation process that can be used to form the blind pixel structure layer 202 and the detection structure layer 201 as shown in FIG. 23 includes: referring to FIG. 22, injecting perpendicularly only to the surface of the detection structure layer 201, thereby forming a blind pixel structure layer 202 in the surface layer of the top and bottom of the detection structure layer 201, as shown in FIG. 23.

Embodiment 3

The present disclosure will be further described in detail below with reference to FIGS. 24 to 29 and specific embodiments. It should be noted that the drawings all adopt a very simplified form and use the non-precise proportion and are only used for conveniently and clearly achieving the purpose of assisting in describing the embodiment.

Figure 24:
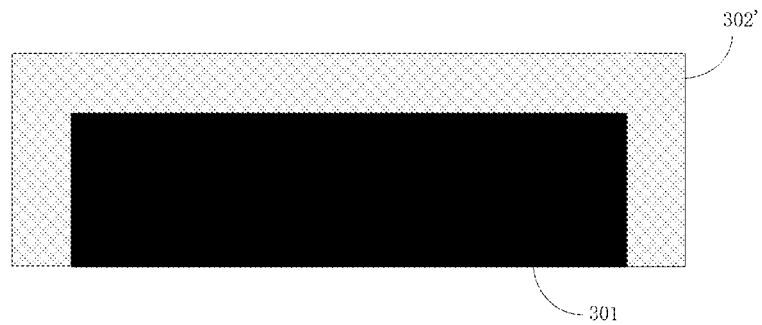
FIGS. 24-26 are schematic diagrams of the preparation steps of an effective pixel of an image sensor according to a third embodiment of the present disclosure
Figure 25:
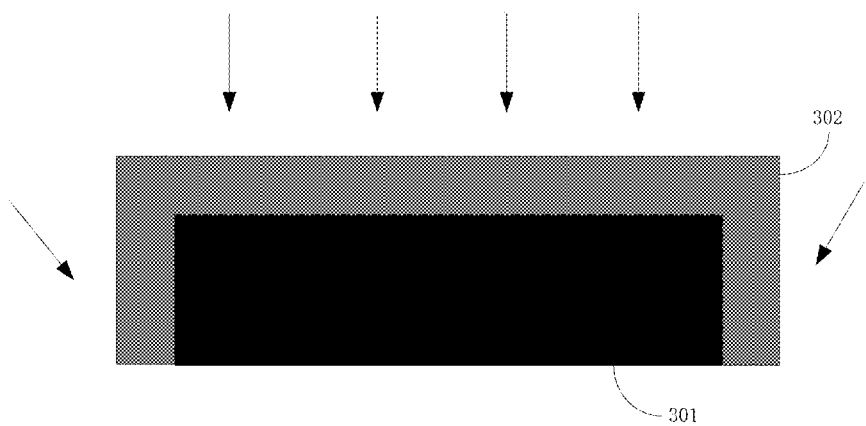
Figure 26:
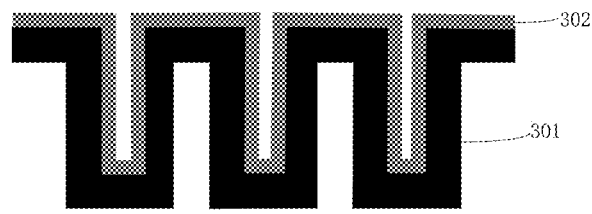

The difference between the third embodiment and the first and second embodiments is that the detection structure layer and the blind pixel structure layer are stacked on top of each other. Referring to FIG. 26, in the effective pixel structure, the blind pixel structure layer 302 is located on the sidewalls and top surface of the detection structure layer 301, that is, the blind pixel structure layer 302 covers the detection structure layer 301. FIGS. 24 and 25 are enlarged cross-sectional views of the area indicated by the dotted circle of FIG. 19. The preparation of the blind pixel structure layer 302 includes: referring to FIG. 24, depositing on the sidewall and the top of the detection structure layer 301 by a deposition process to form a material layer 302'; please refer to FIG. 25, and then performing an ion implantation on the material layer 302' of the deposited blind pixel structure layer, thereby obtaining a second conductivity type non-sensitive material layer as the blind pixel structure layer 302 as shown in FIG. 26.

Figure 27:
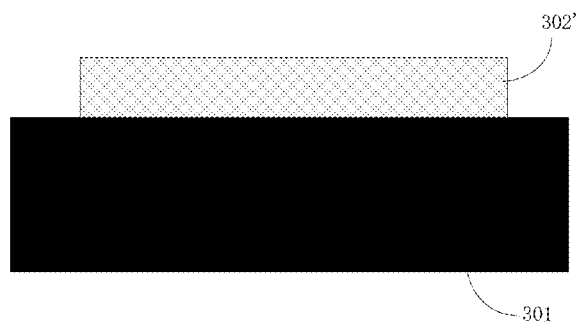
FIGS. 27-29 are schematic diagrams of the preparation steps of an effective pixel of an image sensor according to the third embodiment of the present disclosure
Figure 28:
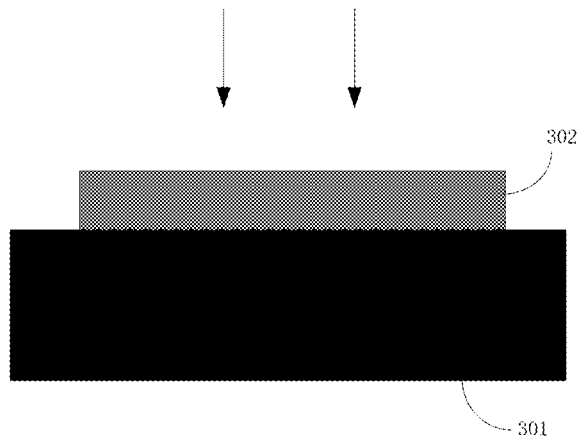
Figure 29:
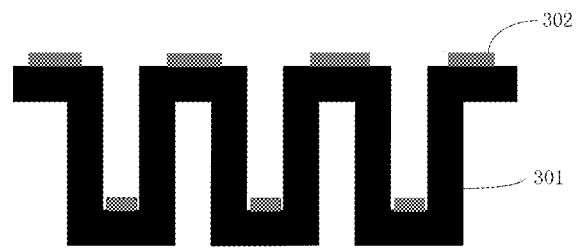

Referring to FIG. 29, in the effective pixel structure, the blind pixel structure layer 302 is only located on the top and bottom of the detection structure layer 301. FIGS. 27 and 28 are enlarged views of the area indicated by the dotted circle in FIG. 19. The preparation of the blind pixel structure layer 302 includes: referring to FIG. 27, forming a material layer 302' on top of the detection structure layer 301 by a deposition process; referring to FIG. 28, and then ion implementing the material layer 302' of the deposited blind pixel structure layer, thereby obtaining a second conductivity type non-sensitive material layer as shown in FIG. 29; patterning the second conductivity type non-sensitive material layer to form a blind pixel structure layer 302 of a desired pattern.

Embodiment 4

An infrared detector of this embodiment has an effective pixel array, and each effective pixel in the effective pixel array includes a detection structure layer and a blind pixel structure layer; the detection structure layer and the blind pixel structure layer are respectively on the surfaces of the two sidewalls of an undoped fin structure.

In the image sensor structure design of this embodiment, the design distribution of the existing effective pixel array and the blind pixel array is changed, and the blind pixel array area in the existing design is deleted. In order to improve the detection sensitivity and effectively eliminate the noise, the blind pixel structure layer and the detection structure layer are combined in the effective pixel, thereby not only reducing the volume, improving the device integration degree, but also effectively improving the device detection sensitivity.

In addition, in one embodiment of the present disclosure, the output of each effective pixel adopts a three-terminal output, thereby not only saving the space, improving the integration degree, but also realizing the synchronous and fast output of the detection structure layer and the blind pixel structure layer.

The present disclosure will be further described in detail below with reference to FIGS. 30-43 and specific embodiments. It should be noted that the drawings all adopt a very simplified form and use the non-precise proportion and are only used for conveniently and clearly achieving the purpose of assisting in describing the embodiment.

Figure 30:
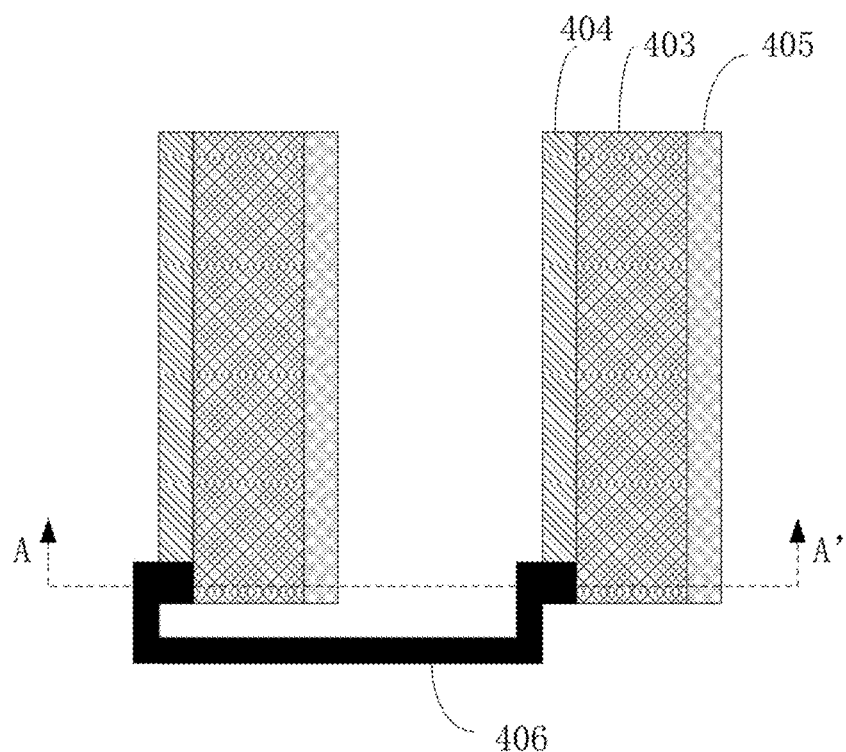
FIG. 30 is a top view of an infrared detector according to a preferred embodiment of the present disclosure.
Figure 31:
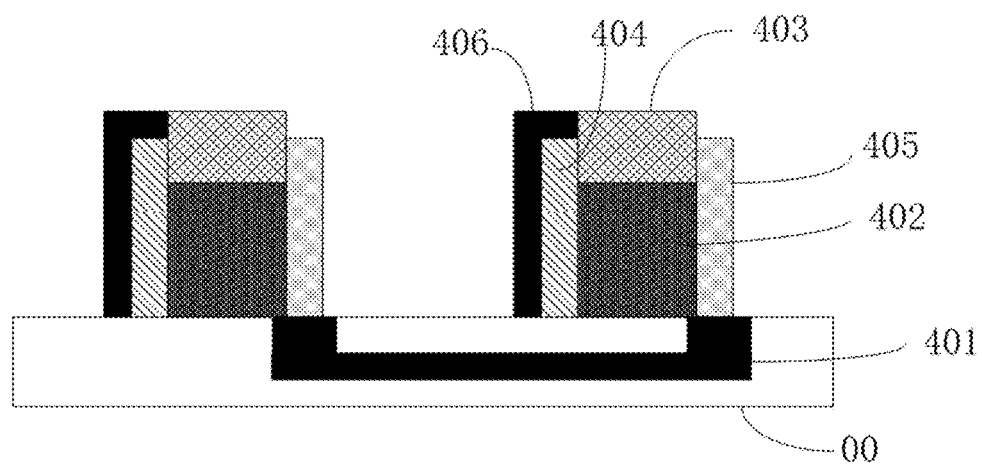
FIG. 31 is a schematic cross-sectional structure diagram of the infrared detector in the AA'direction of FIG. 30

Referring to FIGS. 30-31, the effective pixel array of the infrared detector in this embodiment has two undoped fin structures 402. The material of the undoped fin structures 402 maybe, but not limited to, amorphous silicon. A detection structure layer 404 and a blind pixel structure layer 405 are respectively disposed on the two sidewalls of each of the undoped fin structures 402. Here, the detection structure layer 404 is a first conductivity type sensitive material layer, and the blind pixel structure layer 405 is a second conductivity type non-sensitive material layer; the first conductivity type and the second conductivity type are different, preferably, the first conductivity type is P-type, and the second conductivity type is N-type. In order to avoid electrical connecting or shorting between the detection structure layer 404 and the blind pixel structure layer 405, an injection barrier layer 403 may also be disposed on top of the undoped fin structure 402.

As shown in FIG. 30, two rectangular fin structures 402 are arranged in parallel and spaced apart. Preferably, each of the fin structures 402 may be U-shaped or serpentine on the horizontal plane, thereby expanding the detection area and detection sensitivity.

Figure 32:
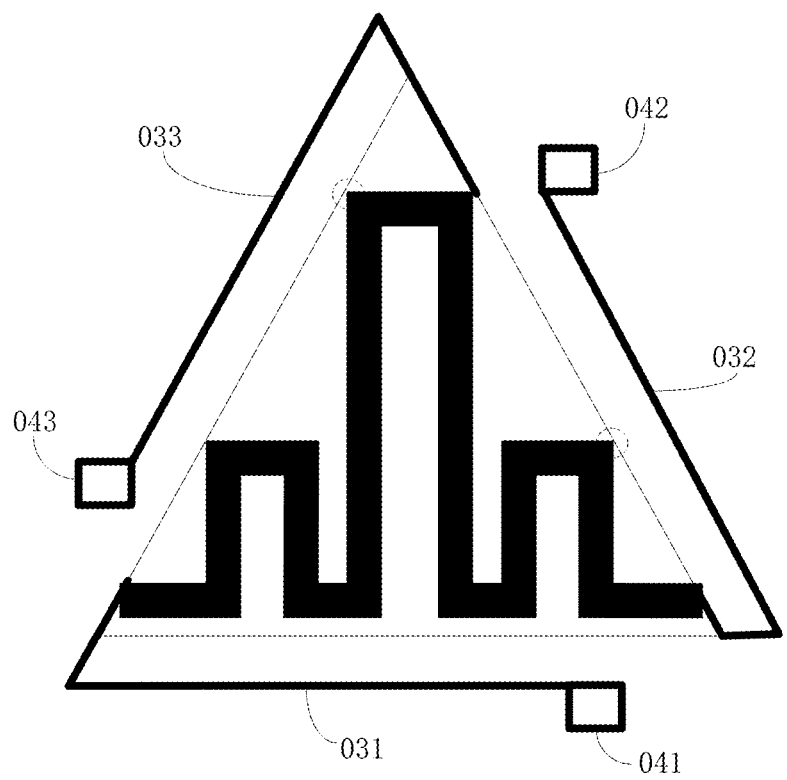
FIG. 32 is a schematic structural diagram of an effective pixel and a conductive beam of an image sensor according to an embodiment of the present disclosure
Figure 33:
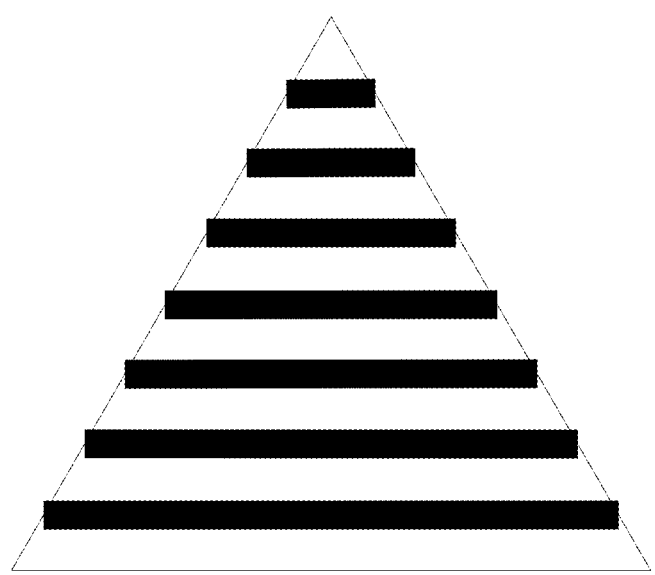
FIG. 33 is a top view schematic diagram of an infrared detector according to another preferred embodiment of the present disclosure

In addition, referring to FIGS. 32 and 33, it should be noted here that in FIGS. 32 and 33, the fin structure is represented using only thick black lines, and the thin line triangle indicates the shape in which the fin structure is arranged. The top view shape of the effective pixels in this embodiment may be triangular. For example, as shown in FIG. 32, the serpentine fin structure (shown by the black thick band) is arranged in a triangular shape on a horizontal surface; or as shown in FIG. 33, the rectangular fin structure (shown by the black thick band) is arranged in a triangle or the like, so that the synchronous output of the detection structure layer 404 and the blind pixel structure layer 405 can be realized. In this embodiment, please refer to FIG. 32 and FIG. 30-31. The thick solid line in FIG. 32 indicates the conductive beams 031, 032, and 033. One end of the detection structure layer 404 and one end of the blind pixel structure layer 405 are jointly connected to a first shared extraction electrode 041, and the other end of the detection structure layer 404 and the other end of the blind pixel structure layer 405 are respectively connected to the second extraction electrode 042 and the third extraction electrode 043. In this embodiment, the top view of each effective pixel is triangular, and the first conductive beam 031, the second conductive beam 032, and the third conductive beam 033 are disposed outside the triangle, and the first conductive beam, the second conductive beam and the third conductive beam are parallel to the three sides of the triangle respectively; one end of the detection structure layer 404 and one end of the blind pixel structure layer 405 are located at one corner of the triangle, and are electrically connected to the first shared extraction electrode 041 through the first conductive beam 031, and the other end of the detection structure layer 404 is located at one of the remaining two corners of the triangle and is connected to the second extraction electrode 042 through the second conductive beam 032. The other end of the blind pixel structure layer 405 is located at the remaining corner of the triangle and is connected to the third extraction electrode 043 through the third conductive beam 033. As shown in FIG. 32 and in conjunction with FIG. 31, one end of the detection structure layer 404 and one end of the blind pixel structure layer 405 extend in the same first direction and are connected to the conductive beam 031; the other end of the detection structure layer 404 extends in a second direction opposite to the first direction and is connected with the conductive beam 032; the other end of the blind pixel structure layer 405 extends in the second direction opposite to the first direction, and is connected to the conductive beam 033. It should be noted that the conductive beam 033 may not be connected with the other end of the blind pixel structure layer 405, and is directly connected with the part of the blind pixel structure 405 which is close to the vertex angle of the triangle, as shown in the dotted line circle in FIG. 32.

Figure 34:
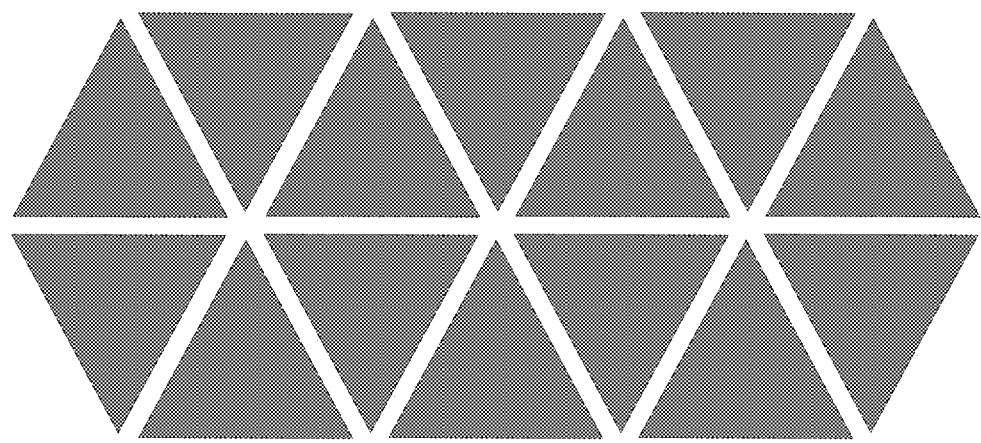
FIG. 34 is a top view schematic diagram of an effective pixel array of an infrared detector according to another preferred embodiment of the present disclosure

Referring to FIG. 34, each of the effective pixels of the present embodiment is simplified using a triangle in FIG. 34, where adjacent sides between the triangular effective pixels are parallel and are arranged accordingly. Thereby, an effective pixel area is obtained, thereby improving the detection area, integration degree, and detection sensitivity.

Figure 35:
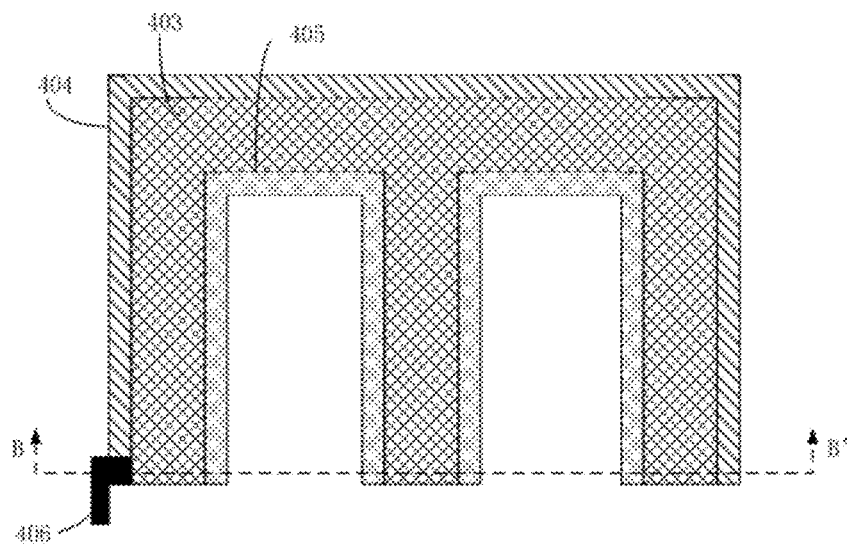
FIG. 35 is a top view schematic diagram of an infrared detector according to another preferred embodiment of the present disclosure
Figure 36:
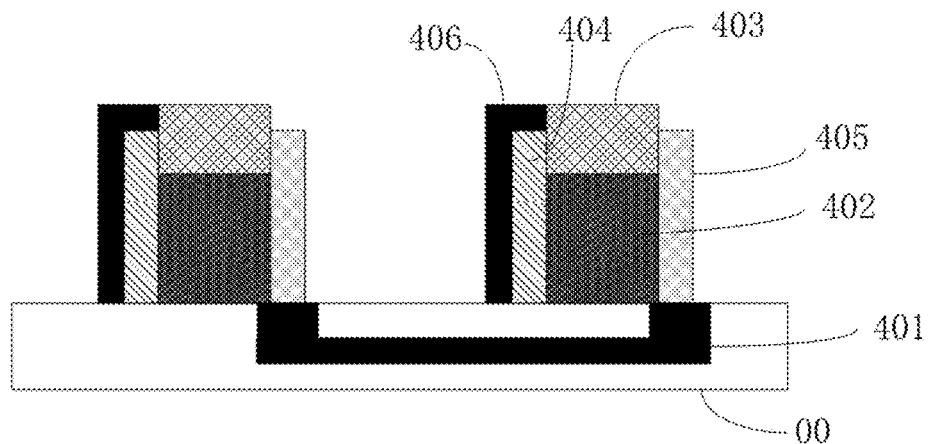
FIG. 36 is a schematic cross-sectional structure diagram of an infrared detector in the BB'direction of FIG. 35

Referring to FIG. 35 and FIG. 36, in another embodiment of the present disclosure, each fin structure 402 in the effective pixel has four sub-fin structures, wherein three vertical sub-fin structures are arranged in parallel, and the remaining one is a horizontal sub-fin structure which is perpendicularly intersected with each end of the three vertical sub-fin structures to form a comb-teeth shape structure; the comb-shaped fin structure 402 includes comb teeth and a trunk; and the outermost side of the outer surface of the comb teeth and the outer surface of the trunk are provided with the detection structure layer 404, and the inner side surface of the trunk and the sidewalls of the comb teeth are provided with the blind pixel structure layer 405; or vice versa, the outermost side of the outer surface of the comb teeth and the outer surface of the trunk are provided with the blind pixel structure layer 405, and the inner side surface of the trunk and the sidewalls of the comb teeth are provided with the detection structure layer 404. In addition, referring to FIG. 31, the upper electrode layer 406 of the detection structure layer 404 connecting each fin structure 402 is connected from the sidewall surface of the fin structure 402 and led out; the lower electrode layer 401 of the blind pixel structure layer 405 connecting each fin structure 402 is connected from the bottom of the fin structure 402 and led out; or, in other embodiments, the upper electrode layer 406 of the blind pixel structure layer 405 connecting each fin structure 402 is connected from the sidewall surface of the fin structure 402 and led out; the lower electrode layer 401 of the detection structure layer 404 connecting each fin structure 402 is connected from the bottom of the fin structure 402 and led out.

It should be noted that the fin structure 402 can adopt any shape, and the above-mentioned three-terminal output design can be adopted, that is, one end of the detection structure layer 404 and one end of the blind pixel structure layer 405 are jointly connected to a first shared extraction electrode, and the other end of the detection structure layer 404 and the other end of the blind pixel structure layer 405 are respectively connected to the second extraction electrode and the third extraction electrode, thereby improving the detection precision and the detection sensitivity of the device.

In the above infrared detector of the present embodiment, according to the formula $R=\rho*L/(W*t)$, wherein W is the width, L is the length, and t is the thickness, here, the doped film is the detection structure layer 404 and the blind pixel structure layer 405, the thickness of the detection structure layer 404 and the blind pixel structure layer 405 are ignored, The thickness of the undoped film which is also the height of the fin structure 402 is L, regardless of the shape of the fin structure, and the perimeter of the outer contour of the fin structure is approximated as W, so that the obtained error R is small, so that the flexible adjustment of the resistance of the detector is not affected by the lithography and film thickness, and the detection sensitivity is improved.

Figure 37:
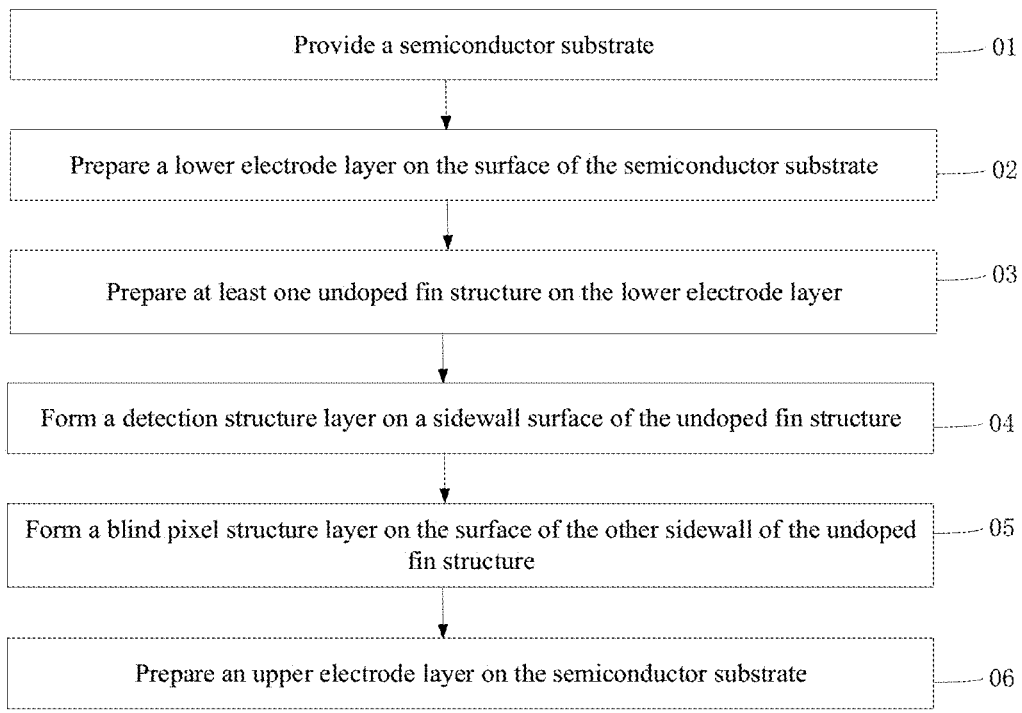
FIG. 37 is a flow diagram of a preparation method of an infrared detector according to a preferred embodiment of the present disclosure
Figure 38:
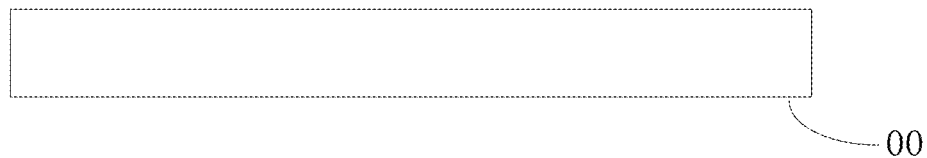
FIGS. 38-43 are schematic diagrams of various preparation steps of the preparation method of the infrared detector of FIG. 37
Figure 39:
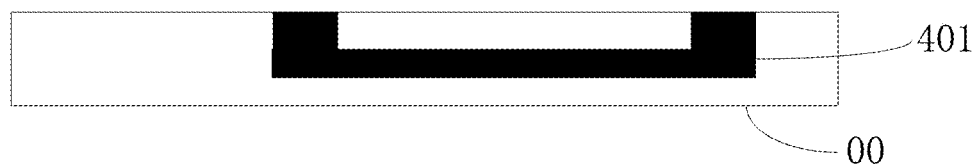

Referring to FIG. 37, a method for preparing an infrared detector shown in FIG. 30 of the above embodiment, wherein at least one effective pixel is prepared, and the preparation method of each effective pixel includes:

Step 01: Please refer to FIG. 38, providing a semiconductor substrate 00;

Specifically, the semiconductor substrate 00 herein is a silicon substrate.

Step 02: Please refer to FIG. 39, preparing a lower electrode layer 401 on the surface of the semiconductor substrate 00;

Specifically, the lower electrode layer 401 can adopt a conventional interconnection process, for example, depositing a first dielectric layer on the surface of the silicon substrate, etching a trench in the first dielectric layer, filling the trench with a conductive material, and then depositing a second dielectric layer on top of the first dielectric layer and the conductive material, etching a via hole in the second dielectric layer, filling a conductive material in the via hole, and performing a planarization process to make the second dielectric layer is flush with the top of the via hole.

Figure 40:
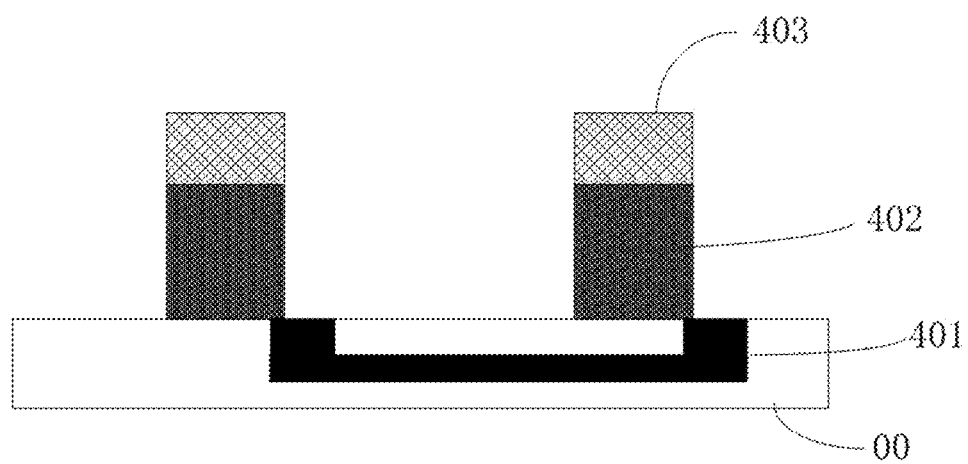

Step 03: Referring to FIG. 40, preparing at least one undoped fin structure 402 on the lower electrode layer 401;

Specifically, the material layer of the undoped fin structure 402 may be deposited on the lower electrode layer 401 by a deposition process, and then the undoped fin structure 402 is etched by lithography and etching processes. In addition, an injection barrier layer may also be formed on top of the undoped fin structure 402 in order to avoid a short circuit between the detection structure layer 404 and the blind pixel structure layer 405 during subsequent ion implantation.

Figure 41:
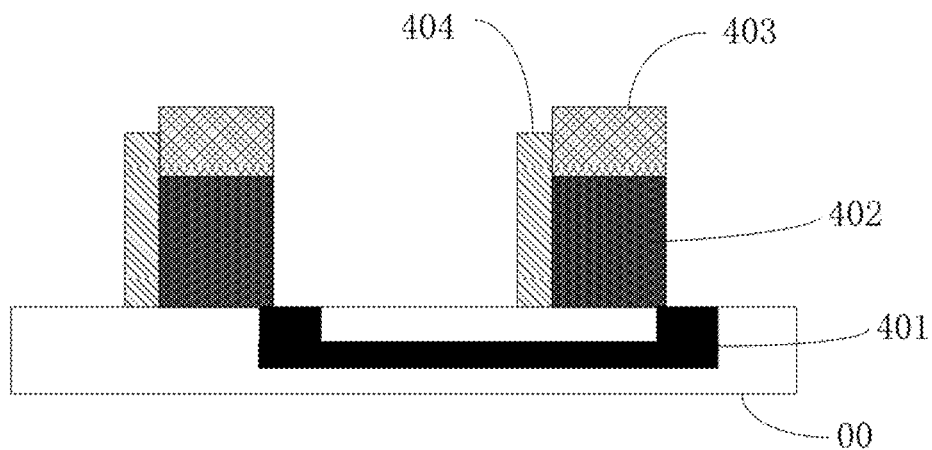
Figure 42:
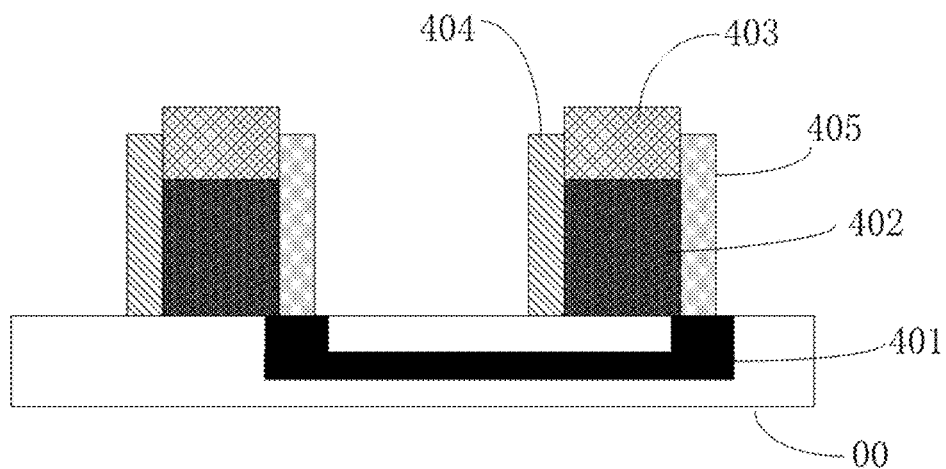
Figure 43:
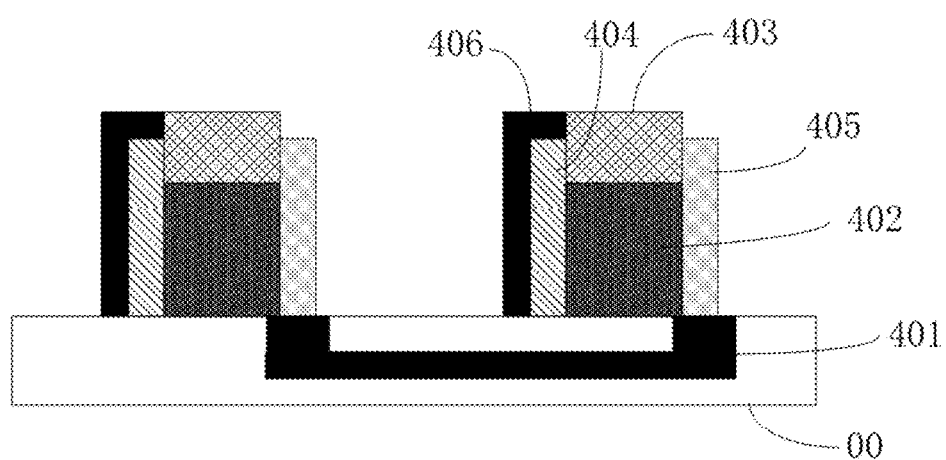

Step 04: Referring to FIG. 41, forming a detection structure layer 404 on a sidewall surface of the undoped fin structure 402;

Specifically, referring to FIG. 41, the formation of the detection structure layer 404 comprises: conducting a first conductivity type ion implantation process, and tilted injecting ions at a first angle of the clockwise rotation in a horizontal direction into one sidewall surface of the undoped fin structure 402, forming a first conductivity type sensitive material layer in a sidewall surface of the undoped fin structure 402 as a detection structure layer 404;

In other embodiments of the present disclosure, the formation of the detection structure layer comprises: forming a first material layer on the surface of one sidewall of the undoped fin structure, and tilted injecting ions at a first angle of the clockwise rotation in a horizontal direction into the first material layer, so that the first material layer forms a first conductivity type sensitive material layer and serves as the detection structure layer;

Step 05: Referring to FIG. 42, forming a blind pixel structure layer 405 on the other sidewall surface of the undoped fin structure 402;

Specifically, referring to FIG. 42, the formation of the blind pixel structure layer 405 comprises: conducting a second conductivity type ion implantation process, and tilted injecting ions at a second angle of the clockwise rotation in a horizontal direction into the other sidewall surface of the undoped fin structure 402, forming a second conductivity type non-sensitive material layer in the other sidewall surface of the undoped fin structure as a blind pixel structure layer 405.

In other embodiments of the present disclosure, the formation of the blind pixel structure layer may include: forming a second material layer on the other sidewall surface of the undoped fin structure, and tilted injecting ions at a second angle of the clockwise rotation in a horizontal direction into the second material layer, so that the second material layer forms a second conductivity type non-sensitive material layer and serves as the blind pixel structure layer Here, the first angle is complementary to the second angle, so that the environment of the detection structure layer and the blind pixel structure layer is the same. The first material layer and the second material layer may be made of the same material, such as silicon oxide or the like.

Step 06: Please refer to FIG. 43, preparing an upper electrode layer 406 on the semiconductor substrate 00;

Specifically, the outer sidewall of the detection structure layer 404 is connected to the upper electrode layer 406, and the bottom of the blind pixel structure layer 405 is connected to the lower electrode layer 401. In other embodiments of the present disclosure, the bottom of the detection structure layer 404 is electrically connected to the lower electrode layer 401, and the outer sidewall of the blind pixel structure layer 405 is connected to the upper electrode layer 406.

It should be noted that the fin structures with other shapes, such as U-shaped, serpentine, or comb-shaped, may also be prepared by the processes of the above steps 01 to 06 in the above embodiments. Except during etching process, the fin structures with different shapes may require different masks; in addition, although the shapes of the U-shaped, serpentine or comb-shaped fin structures are different, the first conductivity type ion implantation may be simultaneously implanted on the same side of the fin structure, the second conductivity type ion implantation may be simultaneously implanted on the opposite side of the fin structure. Therefore, the ion implantation processes can completely adopt the above steps 04 to 05, which will not be described herein.

While the present disclosure has been particularly shown and described with references as preferred embodiments thereof, it will be understood by those skilled in the art that various changes in form and details may be made therein without departing from the spirit and scope of the present disclosure as defined by the claims.

What is claimed is:

1. An image sensor structure which has an effective pixel array, wherein each effective pixel in the effective pixel array comprises: a detection structure layer and a blind pixel structure layer; wherein a first end of the detection structure layer and a first end of the blind pixel structure layer are jointly connected to a first shared extraction electrode, and a second end of the detection structure layer and a second end of the blind pixel structure layer are respectively connected to a second extraction electrode and a third extraction electrode.

2. The image sensor structure of claim 1, wherein the detection structure layer adopts a first conductivity type sensitive material layer, and the blind pixel structure layer adopts a second conductivity type non-sensitive material layer; the first conductivity type and the second conductivity type are different.

3. The image sensor structure of claim 1, wherein the top view of each effective pixel is triangular, and a first conductive beam, a second conductive beam, and a third conductive beam are disposed outside a triangle, and the first conductive beam, the second conductive beam, and the third conductive beam are parallel to three sides of the triangle respectively; the first end of the detection structure layer and the first end of the blind pixel structure layer are located at a first corner of the triangle, and are electrically connected to the first shared extraction electrode through the first conductive beam, and the second end of the detection structure is located at a second corner of the triangle, is connected to the second extraction electrode through a second conductive beam, and the second end of the blind pixel structure layer is located at a third corner of the triangle and is connected to the third extraction electrode through the third conductive beam.

4. The image sensor structure of claim 1, wherein the detection structure layer and the blind pixel structure layer are arranged side by side in a serpentine shape and have space in between.

5. The image sensor structure of claim 1, wherein the blind pixel structure layer is arranged inside or outside a surface of the detection structure layer.

6. The image sensor structure of claim 1, wherein the effective pixel further comprises an undoped fin structure, and the detection structure layer and the blind pixel structure layer are respectively located on surfaces of the two sidewalls of the undoped fin structure.

7. The image sensor structure of claim 6, wherein the undoped fin structure has at least two, and each of the undoped fin structures is arranged in parallel and has space in between.

8. The image sensor structure of claim 7, wherein each fin structure has M sub-fin structures, wherein an amount of M−1 sub fin structures are arranged in parallel, wherein a remaining one of the sub-fin structures is perpendicularly intersected with each end of the M−1 sub-fin structures to form a comb-shaped structure; the comb-shaped fin structure comprises comb teeth and a trunk; and an outermost side of an outer surface of the comb teeth and an outer surface of the trunk are provided with the detection structure layer, and an inner side surface of the trunk and sidewalls of the comb teeth are provided with the blind pixel structure layer; or an outermost side of an outer surface of the comb teeth and an outer surface of the trunk are provided with the blind pixel structure layer, and an inner side surface of the trunk and sidewalls of the comb teeth are provided with the detection structure layer.

9. The image sensor structure of claim 7, wherein an upper electrode layer of the detection structure layer connecting each fin structure is connected from a sidewall surface of the fin structure and led out; a lower electrode layer of the blind pixel structure layer connecting each fin structure is connected from a bottom of the fin structure and led out, alternatively, an upper electrode layer of the blind pixel structure layer connecting each fin structure is connected from a sidewall surface of the fin structure and led out; a lower electrode layer of the detection structure layer connecting each fin structure is connected from a bottom of the fin structure and led out.

10. The image sensor structure of claim 6, wherein an injection barrier layer is also provided on top of the undoped fin structure.

\* \* \* \* \*